United States Patent
Clemente et al.

(10) Patent No.: US 9,570,247 B2
(45) Date of Patent: Feb. 14, 2017

(54) SWITCH STRIP, SAFETY SENSOR STRIP AND PRODUCTION METHOD THEREOF, AND ALSO ANTI-TRAP PROTECTION

(71) Applicant: Cooper Standard GmbH, Lindau / Bodensee (DE)

(72) Inventors: Domenico Clemente, Tettnang (DE); Ulf Barrenscheen, Amtzell (DE); Chantal Seider, Eriskirch (DE)

(73) Assignee: Cooper Standard GmbH, Lindau/Bodensee (DE)

( * ) Notice: Subject to any disclaimer, the term of this patent is extended or adjusted under 35 U.S.C. 154(b) by 0 days.

(21) Appl. No.: 14/890,855

(22) PCT Filed: May 14, 2014

(86) PCT No.: PCT/EP2014/059892
§ 371 (c)(1),
(2) Date: Nov. 12, 2015

(87) PCT Pub. No.: WO2014/184268
PCT Pub. Date: Nov. 20, 2014

(65) Prior Publication Data
US 2016/0104585 A1    Apr. 14, 2016

(30) Foreign Application Priority Data
May 14, 2013    (DE) .......................... 10 2013 104 967

(51) Int. Cl.
*H01H 3/14*        (2006.01)
*F16P 3/12*        (2006.01)
(Continued)

(52) U.S. Cl.
CPC .............. *H01H 3/142* (2013.01); *E05F 15/40* (2015.01); *E05F 15/46* (2015.01); *F16P 3/12* (2013.01);
(Continued)

(58) Field of Classification Search
CPC .................... E05Y 2600/502; E05Y 2600/526; E05Y 2600/53; E05Y 2900/50; F16P 3/12; H01H 3/142; H01H 11/00; H01H 1/029; H03K 17/962; H03K 2217/96078; H03K 17/955; E05F 15/40; E05F 15/46
(Continued)

(56) References Cited

U.S. PATENT DOCUMENTS 4,293,752 A * 10/1981 Koenig .................. H01H 3/142
                                                  174/117 A
8,115,125 B2 * 2/2012 Yasuda .................. H01H 3/142
                                                  200/61.43
(Continued)

FOREIGN PATENT DOCUMENTS

DE    102005028739 B3    6/2006
DE    102006015687 A1    10/2007
(Continued)

OTHER PUBLICATIONS

International Preliminary Report on Patentability in corresponding International Application No. PCT/EP2014/059892 filed May 14, 2014, with English translation of ISR.

*Primary Examiner* — Edwin A. Leon
(74) *Attorney, Agent, or Firm* — Thomas B. Ryan, Patent Agent; Harter Secrest & Emery LLP

(57) ABSTRACT

The invention relates to a switch strip (10) for an apparatus for detecting an obstruction (210) in the movement range (221) of a closure element (220), in particular of an automotive vehicle (200). The switch strip (10) has an inner electrode (20), an outer electrode (30) approximately concentrically surrounding the inner electrode (20) at a distance (D), and a space (40) filled with air, which is arranged between the outer electrode (30) and the inner electrode (20) and which is dielectric. Furthermore, the switch strip (10) has a spacer (50) which is deformable in a direction trans-
(Continued)

verse to the longitudinal direction. The spacer (50) spaces and insulates the two electrodes (20, 30) from one another. The outer electrode (30) is deformable by a force (F) applied from the outside. The deformation of the outer electrode (30) is able to at least in portions bring the inner electrode (20) and the outer electrode (30) into contact with each other. Such a switch strip (10) is also referred to as a tactile switch strip (10).

20 Claims, 14 Drawing Sheets

(51) Int. Cl.
*H03K 17/955* (2006.01)
*E05F 15/40* (2015.01)
*E05F 15/46* (2015.01)
*H01H 11/00* (2006.01)
*H03K 17/96* (2006.01)

(52) U.S. Cl.
CPC .............. *H01H 11/00* (2013.01); *H03K 17/955* (2013.01); *H03K 17/962* (2013.01); *E05Y 2600/502* (2013.01); *E05Y 2600/526* (2013.01); *E05Y 2600/53* (2013.01); *E05Y 2900/50* (2013.01); *H03K 2217/96078* (2013.01)

(58) Field of Classification Search
USPC ........ 200/600, 61.42–61.44, 61.62; 324/663; 29/622
See application file for complete search history.

(56) References Cited

U.S. PATENT DOCUMENTS

| | | | |
|---|---|---|---|
| 9,202,644 B2* | 12/2015 | Aoyama | ............... H01H 3/60 |
| 2004/0107640 A1 | 6/2004 | Ishihara et al. | |
| 2011/0169513 A1 | 7/2011 | Bolbocianu et al. | |

FOREIGN PATENT DOCUMENTS

| | | |
|---|---|---|
| DE | 102008050897 A1 | 7/2009 |
| DE | 102011077014 A1 | 12/2012 |
| EP | 0405351 A1 | 1/1991 |
| EP | 1 154 110 B2 | 10/2011 |

\* cited by examiner

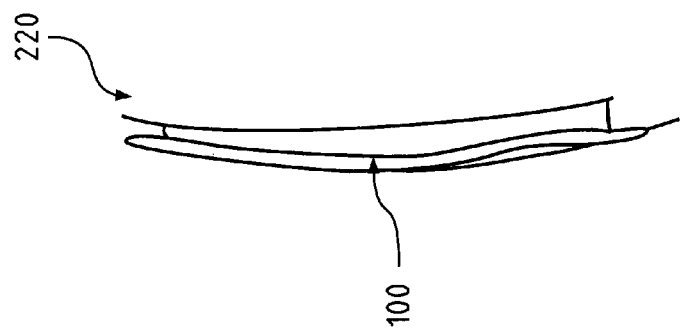
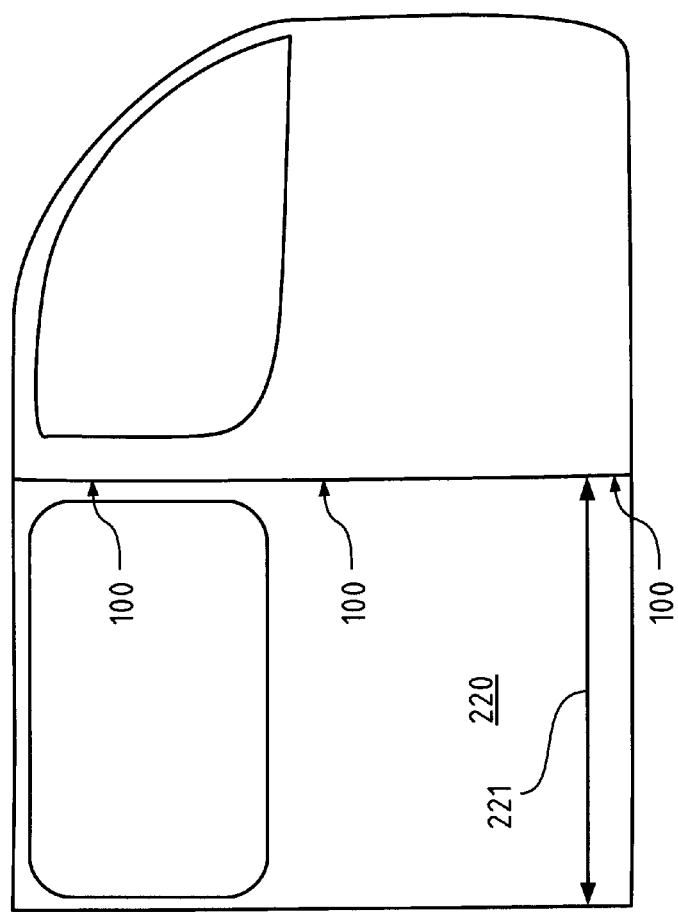

Fig. 13
| ROTATION ANGLE | RADIUS OF CURVATURE (mm) | CONTACT (YES/NO) | SENSOR POSITION |
|---|---|---|---|
| 0° | 30 | NO | 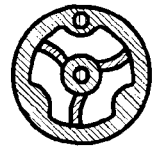 |
| | 20 | NO | |
| | 15 | NO | |
| 30° u | 30 | NO | 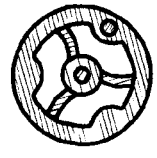 |
| | 20 | NO | |
| | 15 | NO | |
| 30° o | 30 | NO | 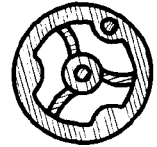 |
| | 20 | NO | |
| | 15 | - | |
| 60° | 30 | NO | 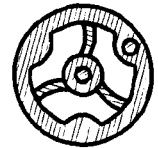 |
| | 20 | NO | |
| | 15 | NO | |

SWITCH STRIP, SAFETY SENSOR STRIP AND PRODUCTION METHOD THEREOF, AND ALSO ANTI-TRAP PROTECTION

TECHNICAL FIELD

The invention relates to a switch strip, in particular a switch strip for an anti-trap protection of an automotive vehicle.

BACKGROUND OF THE INVENTION

Such a switch strip comprises an inner electrode, an outer electrode and a space. The outer electrode surrounds the inner electrode more or less concentrically at a distance. The space between the outer electrode and the inner electrode is insulating and dielectric. The outer electrode is deformable by a force applied from the outside. The deformation of the outer electrode is able at least in portions to bring the inner electrode and the outer electrode into contact with each other.

Such a switch strip is used in closure elements of automotive vehicles, for example in the area of an electrically driven sliding door or with electrically driven windows and flaps, such as trunk lids and doors, as well as sliding sunroofs. The switch strip is part of a safety device to prevent objects or limbs being trapped during the closure operation of the closure element. The switch strip can of course also be used with other electrically driven closure elements, such as windows or doors.

Anti-trap protection systems using such switch strips are basically differentiated into tactile and capacitive anti-trap protection systems. With tactile anti-trap protection systems, deformation of the switch strip is necessary to such an extent that two electrodes come into contact with each other. This necessitates a certain compressive force on the switch strip which can be a drawback in the case of limbs being trapped. Irrespective of this drawback, anti-trap protection systems are equipped with switch strips which also enable a tactile switching function, to ensure, for example, the function of the anti-trap protection when the capacitive switching function fails. In this way the trapping of objects, such as wood or plastic, which cause a non-detectable change in the capacitance of the switch strip, can also be prevented.

On the other hand, capacitive anti-trap protection systems have the advantage that they detect an obstruction as soon as the capacitance of the switch strip is changed. A change in capacitance can occur first when a limb, for example, approaches the switch strip. If for some reason the obstruction is not detected, a further change in capacitance can occur by the deformation of the switch strip. If a switching event is not triggered even at this stage, mutual contacting of the electrodes, at the latest, will trigger a switching event. The switch strip and thus the anti-trap protection system are doubly protected.

Such a switch strip is known from DE 10 2005 028 739 B3. The switch strip disclosed in this reference, comprises an elastically deformable hollow profile body, comprising an inner surface surrounding a cavity. The inner surface includes at least two spaced, electrically conductive contact portions. The contact portions furthermore include one or more switching protrusions.

DE 10 2008 050 897 A1 discloses a profile for sensors for the capacitive detection of obstructions. The profile includes two conductors extending in parallel to the longitudinal direction of the profile and spaced from each other, and is characterized in that at least one third conductor is provided within the profile spaced from the first conductor in the detection direction.

A drawback of this profile is that there is at least one direction in which the detection of obstructions is not as good as in other directions. The orientation thus has to be taken into consideration during installation of the switch strip, which makes the installation cumbersome and expensive.

A further anti-trap protection is known from EP 1 154 110 B2, which comprises a capacitive switch strip. An obstruction is directly detected by means of an electric field, which extends in the scanning range.

A drawback of this switch strip is that certain obstructions, such as wood or plastic, are only poorly detected or not at all.

Further tactile switch strips are known from US 2004/0107640 A1 and DE 10 2011 077 014 A1. These switch strips also have a preferred direction of deformation.

It is thus the object of the present invention to provide an easily manufacturable switch strip, which works irrespective of a particular rotation with respect to the longitudinal axis.

SUMMARY OF THE INVENTION

To achieve this object, the invention proposes a switch strip having the features of claim 1. The switch strip of the present invention is intended for an apparatus for the detection of an obstruction in the movement range of a closure element, in particular of an automotive vehicle. Such a switch strip extends in a longitudinal direction and has a capacitance. The switch strip comprises an inner electrode to which a first electric charge is applicable and an outer electrode to which a second electric charge is applicable. The outer electrode is formed to be approximately circular in a section extending transverse to the longitudinal direction and approximately concentrically surrounds the inner electrode at a distance. Furthermore, the switch strip comprises a space filled with air which is arranged between the outer electrode and the inner electrode and which is dielectric. The switch strip furthermore comprises at least one spacer which is deformable in a direction transverse to the longitudinal direction, which spaces and insulates the two electrodes from each other. The outer electrode is deformable by a force applied from the outside, wherein, when the outer electrode is deformed, the deformation is able to at least in portions bring the inner electrode and the outer electrode into contact with each other.

Since the switch strip according to the present invention has an approximately radial symmetrical configuration, there is no preferred direction of the switching force, which triggers a switching operation in the switch strip so that the switch strip works irrespective of a particular rotation with respect to the longitudinal axis. The switching operation, also referred to as a switching event, is triggered as soon as the two electrodes are in contact with each other. The term "in portions" can refer to a portion of the switch strip both in the axial direction and in the circumferential direction.

According to a further preferred embodiment, the switch strip is used in an apparatus for detecting an obstruction in the movement range of a closure element, in particular of an automotive vehicle. The switch strip extends in a longitudinal direction and has a capacitance. The switch strip comprises an inner electrode to which a first electric charge is applicable and an outer electrode to which a second electric charge is applicable. The outer electrode is formed to be approximately circular in a section extending transverse to the longitudinal direction and approximately concentrically surrounds the inner electrode at a distance. A space is arranged between the outer electrode and the inner electrode and is dielectric. The outer electrode is deformable by a force applied from the outside, wherein the space is formed to cause at least in portions a change in the distance between the outer electrode and the inner electrode when the outer electrode is deformed. The change in distance is able to cause a detectable change in the capacitance of the switch strip.

Due to the approximately radial symmetrical configuration of the switch strip according to the present invention, there is no preferred direction for the switching force triggering a switching operation in the switch strip so that the switch strip works irrespective of a particular rotation with respect to the longitudinal axis. The switch strip is also a capacitor having a certain capacitance. It is thus possible to define the change in capacitance as a switching event which does not necessitate that the two electrodes touch. A corresponding obstruction can trigger a switching operation as soon as it penetrates the area in which the electric field is applied. If it is an obstruction which is not able to cause sufficient change in the capacitance by penetration, such as is the case with plastic or wood obstructions, the switching event is triggered at the latest when the two electrodes touch. As an additional switching event, it is possible to define the change in capacitance when the outer electrode is deformed, before the electrodes touch.

The dielectric space is filled with air to enable simple deformation of the switch strip. In the present context the term "dielectric" describes an insulator of a substance or a mixture of substances able to be polarized exclusively by an external field. In particular, substances and mixtures of substances are not included, which are able to be polarized by being deformed. Piezoelectric substances and mixtures of substances containing such substances are therefore excluded.

The two electrodes of the switch strip can basically be arranged by means of retainers external to the switch strip. However, the inner electrode should be tensioned to prevent inadvertent contacting of the outer electrode. By adding one or more spacers it is possible to bend the switch strip to a certain extent along its longitudinal axis without the electrodes touching. This facilitates use of the switch strip in curved areas, such as on doors and windows of automotive vehicles.

Further preferably, the switch strip comprises a total of at least two spacers. Particularly preferably, the switch strip includes three spacers overall. In an advantageous embodiment, the spacers are equidistantly arranged in the circumferential direction of the electrodes.

Preferably, the spacers are characterized by an approximately rectangular cross-section.

Further spacers additionally stabilize the inner electrode with respect to the outer electrode. When the switch strip is curved, the inner electrode is guided essentially along the neutral fiber by the spacers so that there is no direct contact between the inner and outer electrodes. The equidistant arrangement of the spacers provides more symmetry in the switch strip so that, despite the provision of spacers, orienting the switch strip in the circumferential direction can be dispensed with. The number of spacers can vary and can be adapted to each application. The number of spacers can be increased, for example, when the switch strip is installed with a small radius of curvature in order to prevent an inadvertent switching event.

Preferably, the spacer has a curved configuration in cross-section. Further preferably, the spacer has two curved side surfaces in cross-section.

Preferably, the curved side surfaces are curved in the same circumferential direction as the switch strip.

In an advantageous embodiment, the spacer has a weakening zone. The weakening zone is preferably formed as a recess in the spacer.

If the spacers of the switch strip are already slightly pre-curved, less force is needed to deform the outer electrode of the switch strip. In this way, the spacers act like hinges. The hinges can be further improved by providing a weakening zone. By the selective weakening of the spacer it can selectively hinge at the weakening zones thus more accurately defining the movement. This enables improved triggering of a switching event. The weakening zones are configured in such a way that it is still possible to use the switch strip in curved areas. The weakening zones can be easily created, for example, by selectively omitting material, for example at the end or in the middle of the spacer. Alternatively, the weakening zones can be formed by an elastomeric region having reduced hardness in comparison to the adjacent elastomeric region.

Further preferably, the switch strip comprises at least one, particularly preferably three, protrusions preferably equidistantly spaced in the circumferential direction. Preferably, the protrusions include a curved contact surface. The protrusions are preferably provided on the inner electrode. Particularly preferably, the protrusions are provided on the outer electrode.

Further preferably, the protrusions and the spacers are alternately arranged in the circumferential direction of the switch strip.

The limitation of the radial symmetry of the switch strip caused by the spacers can be at least partially compensated by providing protrusions. To improve this compensation, it is suitable to alternately arrange the spacers and the protrusions in the circumferential direction. When the protrusions are provided on the outer electrode, it is less cumbersome to extrude the switch strip than when the protrusions are arranged on the inner electrode.

In a particularly preferred embodiment, an outer wire is embedded in the outer electrode. Alternatively or additionally, an inner wire is embedded in the inner electrode. The wires can be formed solid or as strands. It is also possible to form the wires by means of a conductive elastomer. The wires can be arranged arbitrarily within the electrodes. The outer wire can thus be arranged, for example, along the entire circumference of the outer electrode. Also, the inner wire can be arranged, for example, offset from the center of the inner electrode.

Preferably, the outer electrode is at least partially made of an elastomer provided with electrically conductive particles. Further preferably, the inner electrode is at least partially made of an elastomer provided with electrically conductive particles. Particularly preferably, the outer electrode and/or the inner electrode are extruded.

With prior-art switch strips, the electrodes are usually formed of a metal, such as copper, or a copper braid. To simplify the production of the switch strip according to the present invention, the inner or the outer electrode or both can be formed of an electrically conductive elastomer. To achieve this, graphite is for example added to the ethylene propylene diene rubber or the thermoplastic elastomer. An electrode thus formed can be easily extruded, is deformable and electrically conductive. To improve the reliability of such a switch strip, wire, such as a copper wire, is embedded in the electrode formed of an electrically conductive elastomer.

In a further preferred embodiment the switch strip comprises an outer sheath which is preferably adjacent to the outer electrode. The sheath preferably comprises a sliding layer, which is particularly preferably of a paint, a thermoplastic vulcanizate and/or a foil. The sheath can also be formed by the sliding layer, which for this case is preferably formed to be insulating.

Such a switch strip can also be used when no insulation of the outer electrode is provided by a retaining means of the switch strip. The sliding layer facilitates ease of installation (threading) in retainers, which are formed of hollow profiles. Usually, the sliding layer is of a paint, a thermoplastic vulcanizate and/or a foil.

Preferably, an adhesive base is provided. The adhesive base is preferably provided on the sheath and is for adhesively gluing the switch strip on a surface. Preferably, the adhesive base comprises an adhesive tape, wherein the adhesive tape is preferably arranged on a surface of the adhesive base facing away from the switch strip.

Alternatively, a tie-in base is provided. The tie-in base is preferably provided on the sheath and is suitable for tying into an opening such as a slot or a recess.

Alternatively, a trapping base is provided. The trapping base is preferably provided on the sheath and is suitable for the placement on flanges, for example. The trapping base can also be reinforced in its retaining function by a reinforcing inlay.

By providing the adhesive or the tie-in base, or the trapping base, the switch strip can be installed entirely without a carrier profile.

Further preferably, the sheath and/or the spacer and/or the adhesive base and/or the tie-in base are made of an elastomer, preferably an ethylene propylene diene rubber (EPDM) or a thermoplastic elastomer (TPE). Preferably, the sheath and/or the spacer and/or the adhesive base and/or the tie-in base and/or the trapping base are extruded.

This configuration of the switch strip is easily manufacturable since it can be extruded in one processing step.

The invention also relates to a switch strip for an apparatus for detecting an obstruction in the movement range of a closure element, in particular of an automotive vehicle. The switch strip extends in a longitudinal direction and has a center and a capacitance. The switch strip comprises a ground electrode, which has a concave inner contact surface and to which a first electric charge is applicable. The switch strip further comprises a sensor electrode including a convex inner contact surface and to which a second electric charge is applicable and which is opposite the ground electrode. The switch strip comprises a sheath insulating the two electrodes against each other, which is deformable. The sheath includes a sensor portion and a ground portion. Furthermore, the switch strip comprises a space arranged between the ground electrode and the center electrode and which is dielectric. The ground electrode is arranged in the ground portion and the sensor electrode is arranged in the sensor portion. The inner contact surfaces face each other. The ground electrode and the sensor electrode are moveable relative to each other.

It is preferable for the inner contact surfaces to be directly opposing. Further preferably, the ground electrode comprises a first convex outer contact surface facing away from the sensor electrode. Further preferably, the sensor electrode comprises a second convex outer contact surface facing away from the ground electrode.

Preferably the sensor portion is formed to be electrically conductive. Preferably the switch strip comprises a ground wire preferably embedded in the ground electrode. Further preferably the switch strip comprises a sensor wire preferably embedded in the sensor electrode.

Further preferably, the ground electrode comprises two protrusions, which are preferably able to embrace the concave inner contact surface. Preferably, the protrusions are convexly curved and preferably have approximately identical radii of curvature. Further preferably, the radius of curvature of the concave inner contact surface is larger than the radii of curvature of the protrusions.

It is preferred for the switch strip to have a sliding layer, in particular of TPV, paint and/or foil, which is preferably applied along the entire circumference of the switch strip.

The invention also relates to a safety sensor strip comprising a carrier profile including an attachment portion and a receiving portion. Furthermore, the safety sensor strip comprises an embodiment of the switch strip according to the present invention, which is arranged in the receiving portion.

The switch strip according to the present invention is usually not used alone but in combination with a carrier profile. Such a carrier profile can be a sealing profile, for example. The combination of switch strip and carrier profile will be referred to as safety sensor strip or sensor strip for short.

Preferably, the receiving portion comprises a cavity and the switch strip is arranged in the cavity. Particularly preferably, the cavity includes a sliding layer, in particular of a paint, a thermoplastic vulcanizate and/or a foil.

The safety sensor strip with the sliding layer allows various embodiments of the switch strip or prior-art switch strips to be simply threaded in a cavity of the carrier profile. Threading of the switch strip can be further facilitated with the help of pressurized air.

Preferably, the attachment portion is configured to be attached to a protrusion of an automotive vehicle. Preferably, the attachment portion comprises an adhesive layer. Further preferably, the attachment portion comprises a sealing substance.

Such a sensor strip is used, for example, in vehicles having power windows or electrically driven doors or flaps. The sensor strip can either be adhesively glued to a preexisting installation surface or can be set on a protrusion or flange of the automotive vehicle or can be inserted in recesses having corresponding configurations. The sealing substance in the attachment portion prevents the ingress of humidity and/or foreign bodies, so that the protrusion or flange is better protected. In addition, the carrier profile has an increased sealing action.

The invention also relates to an apparatus for detecting an obstruction in the movement range of a closure element, in particular of an automotive vehicle. Such an apparatus comprises at least one safety sensor strip according to an embodiment of the present invention. The apparatus also comprises a control unit which controls an opening or closing operation of the closure element in dependence on the safety sensor strip.

It is preferable for the control unit to interrupt a movement of the closure element in dependence on the safety sensor strip. Alternatively or additionally it is preferable for the control unit to reverse the movement of the closure element in dependence on the safety sensor strip.

The sensor strip, together with a control unit, forms an apparatus for detecting an obstruction. Such an apparatus, also referred to as an anti-trap protection, controls the movement of a closure element, such as a window or an automotive vehicle door, in dependence on the sensor strip.

Preferably, the control unit applies the first electric charge and the second electric charge to the safety sensor strip in such a way that an electric field can be generated. The electric field floods the surroundings of the safety sensor strip. The control unit is further preferably configured in such a way that it can detect penetration of the obstruction in the flooded surroundings due to a change in the capacitance.

An anti-trap protection with such a configuration is doubly secured. If an obstruction penetrates the flooded surroundings of the safety sensor strip and thus changes the capacitance the control unit detects this as a switching event and controls the closure element correspondingly. If the obstruction cannot change the capacitance sufficiently, the control unit detects the change in capacitance of the switch strip due to the deformation of the outer electrode. The outer electrode and the inner electrode are not yet in contact. If, however, even this change in capacitance is not registered by the control unit, as a final step, the direct contact of the electrodes is defined as a switching event, which is definitely detectable.

The invention also relates to a method of manufacturing a safety sensor strip according to the present invention. To achieve this, a carrier profile, known as such, including a receiving portion, in particular with a cavity, and an attachment portion, and a switch strip according to the present invention are provided. The switch strip is threaded into the cavity.

It is preferred for the switch strip and/or the receiving portion, in particular the cavity, to be provided with a sliding layer, in particular of a paint, a thermoplastic vulcanizate and/or a foil. Preferably, the attachment portion is provided with an adhesive layer, in particular after the switch strip has been threaded into it.

Particularly preferably, the switch strip is threaded while being rotated. Alternatively or additionally, pressurized air is applied to the boundary volume between the outer surface of the switch strip and the inner surface of the receiving portion during threading.

Usually the switch strip and the carrier profile are manufactured separately and only subsequently combined. The carrier profile is mostly a sealing profile. Depending on the configuration of the receiving portion, the switch strip is simply pressed into the receiving portion, or in the case in which the receiving portion comprises a cavity, is threaded into the latter. Reducing the friction between the switch strip and the receiving portion and/or the cavity by means of the sliding layer and/or the application of pressurized air facilitates threading. Inadvertent rotation of the switch strip along its longitudinal axis is less relevant due to the high degree of symmetry and does not require correction to ensure a reliable switching function. The reliability of the safety sensor strip can be further enhanced by controlled rotation of the switch strip during threading. A safety sensor strip of this type can also be manufactured with increased ease and low cost.

BRIEF DESCRIPTION OF THE DRAWING FIGURES

Exemplary embodiments of the present invention will be described in the following with reference to the accompanying drawings, wherein:

FIG. 2 is a lateral partial view of an electrically movable automotive vehicle door with a safety sensor strip;

FIG. 3 is a plan view of the automotive vehicle door of FIG. 2;

FIG. 13 is a table giving an overview of the possible bending radii of the above-mentioned exemplary embodiments;

DETAILED DESCRIPTION OF THE INVENTION

Figure 5:
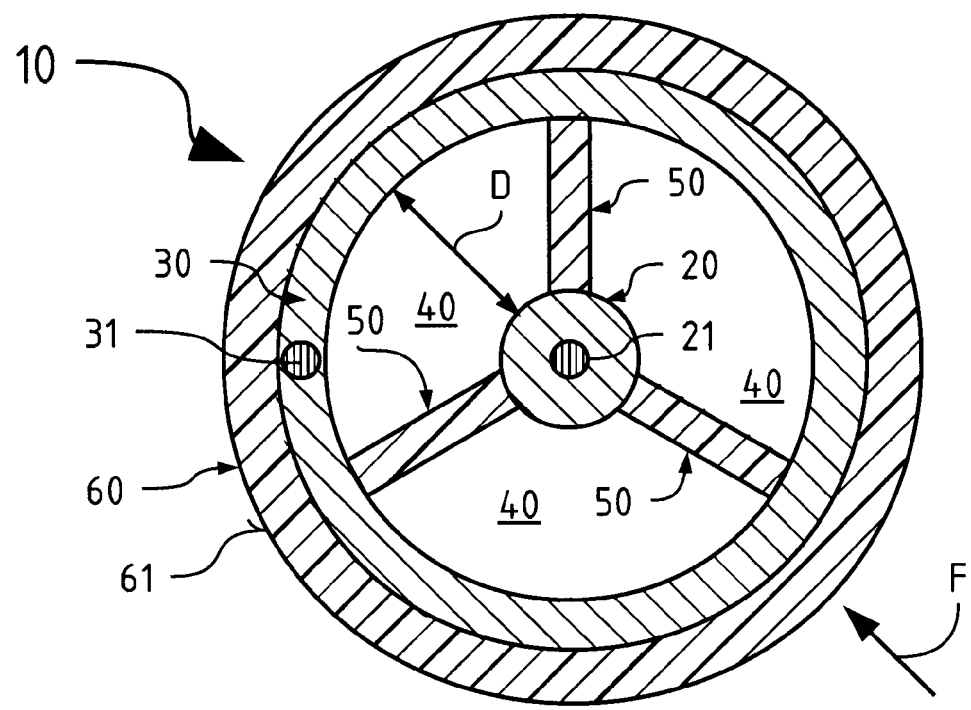
FIG. 5 is a cross-section of a first exemplary embodiment of the switch strip.

The first exemplary embodiment of a switch strip 10, with reference to FIG. 5, comprises an inner electrode 20, an outer electrode 30, a space 40, three spacers 50 and a sheath 60. The switch strip 10 has a capacitance and extends in a longitudinal direction vertical to the drawing plane.

The inner electrode 20 is formed of an ethylene propylene diene rubber (EPDM) provided with a conductive additive, such as graphite. An inner wire 21 of a conductive material, such as copper, is embedded in the inner electrode 20. The outer electrode 30, just like the inner electrode 20, is formed of EPDM provided with a conductive additive, such as graphite, and has an embedded outer wire 31, also made of a conductive material, such as copper. The space 40 which is between the inner electrode 20 and the outer electrode 30 is filled with air. The spacers 50 are of a thermoplastic elastomer (TPE) or EPDM and are electrically insulating. The sheath 60 is provided with a sliding layer 61 of paint.

The outer electrode 30 approximately concentrically surrounds the inner electrode 20. It is not necessary for the inner electrode 20 to be exactly in the center of the outer electrode 30. Depending on the curvature of the switch strip 10 it is possible that the inner electrode 20 is closer to the outer electrode 30 on one side than on the other. The spacers 50, which are equidistantly arranged in the circumferential direction, space and insulate the two electrodes 20, 30 from each other so that there is still no direct contact between the two electrodes 20, 30. When the switch strip 10 is bent, the spacers 50 position the inner electrode 20 essentially along the neutral fiber of the curvature. The inner electrode 20 and the outer electrode 30 are then at a distance D from each other in the radial direction.

If a force F is now applied from the outside to the switch strip 10, first the sheath 60 and directly thereafter the outer electrode 30 is deformed. This in portions changes the distance D between the two electrodes 20, 30. Since the switch strip 10 forms an essentially cylindrical capacitor, the capacitance of the switch strip 10 changes when the distance D is changed between the electrodes 20, 30. This change in capacitance can be detected by a suitable electronic circuit, such as the control unit described further below, and can thus constitute a switching event.

If the force F is sufficiently strong, the switch strip 10, or the outer electrode 30 and the sheath 60, will be deformed to such an extent that the two electrodes 20, 30 come into contact with each other. This short circuit can also constitute a switching event.

Figure 6:
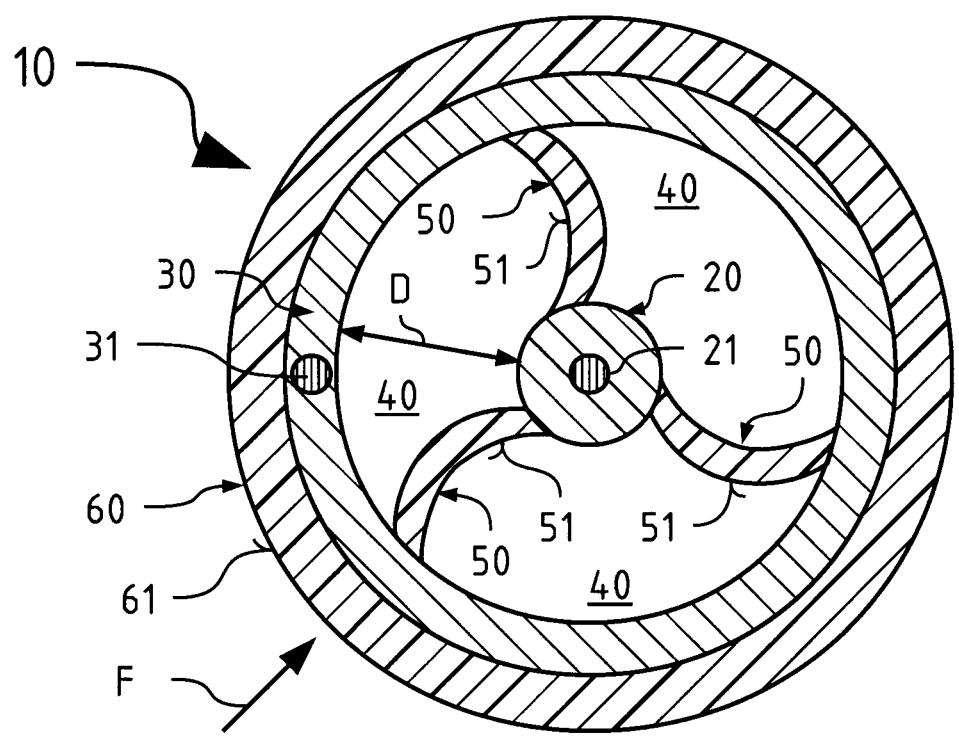
FIG. 6 is a cross-section of a second exemplary embodiment of the switch strip.

The second exemplary embodiment of a switch strip 10, with reference to FIG. 6, is similar to the first exemplary embodiment and will therefore only be described in terms of its differences.

The switch strip 10 according to the second exemplary embodiment has three spacers 50, each having two curved side surfaces 51. The spacers 50 therefore have the shape of a circular segment. If the force F is applied to the switch strip 10 from the outside, the spacers 50 allow easier deformation of the switch strip 10, since they buckle more easily. Herein, a first end of a spacer 50, which is arranged on the outer electrode 30, is moved toward a second end of the spacer 50 arranged on the inner electrode 20. The curved side surfaces 51 are further curved and moved in a circumferential direction of the switch strip 10. The spacer 50 in this case behaves similarly to a hinge.

Figure 7:
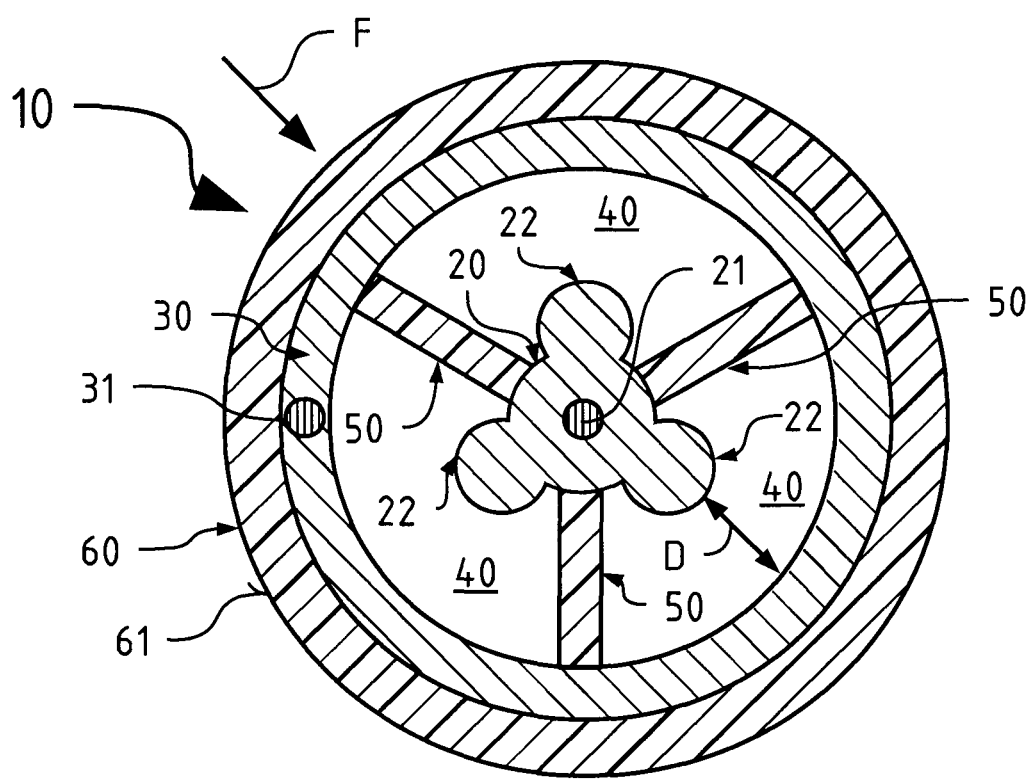
FIG. 7 is a cross-section of a third exemplary embodiment of the switch strip.

A switch strip 10 according to a third exemplary embodiment, with reference to FIG. 7, is similar to a switch strip according to the first exemplary embodiment and will therefore only be described in terms of its differences.

The switch strip 10 in comparison to the first exemplary embodiment comprises an inner electrode 20 which has three protrusions 22. The protrusions 22 are alternately arranged with spacers 50 in the circumferential direction. If a force F is applied from the outside to the switch strip 10, the outer electrode 30 will contact the inner electrode 20 substantially earlier. To trigger a switching event, a smaller force F is thus needed. An obstruction can thus be detected substantially earlier and more safely.

Figure 8:
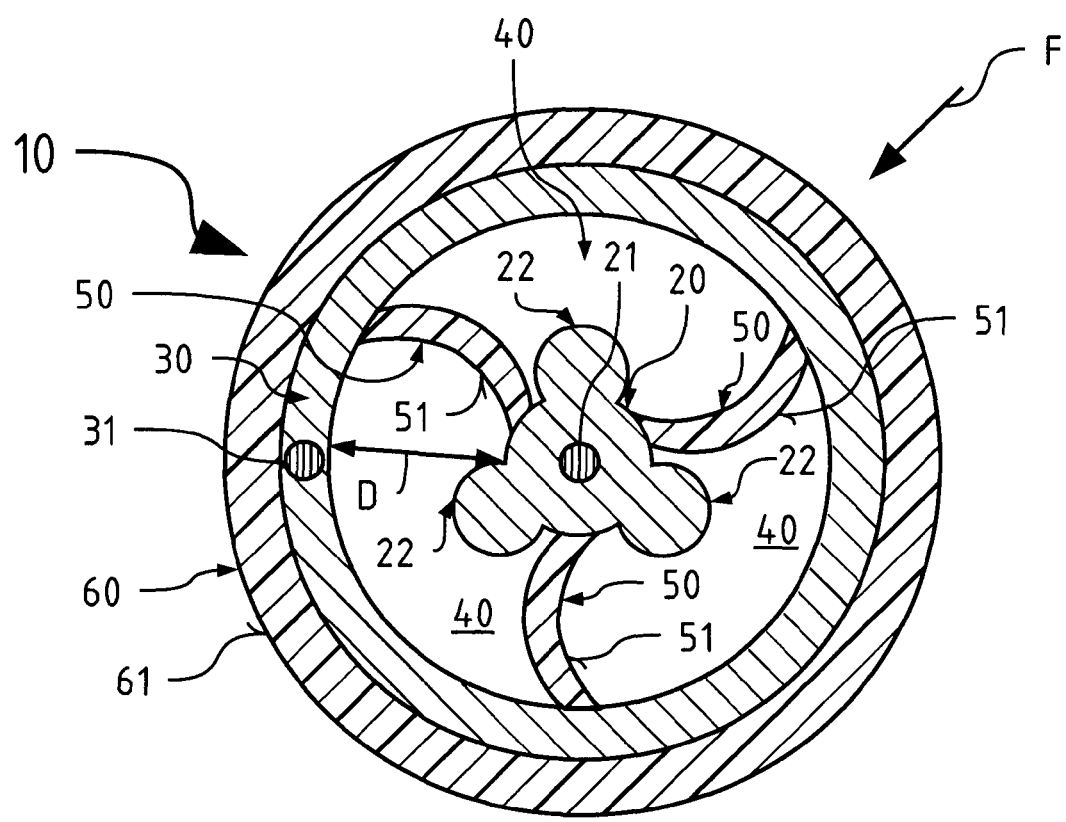
FIG. 8 is a cross-section of a fourth exemplary embodiment of the switch strip.

A switch strip 10 according to the fourth exemplary embodiment, with reference to FIG. 8, combines all the advantages of the other exemplary embodiments. The switch strip 10 thus comprises both the curved spacers 50 and the protrusions 22. This switch strip 10 is very easily deformable by an external force F and can detect a switching event in both a capacitive and a tactile manner.

Figure 9:
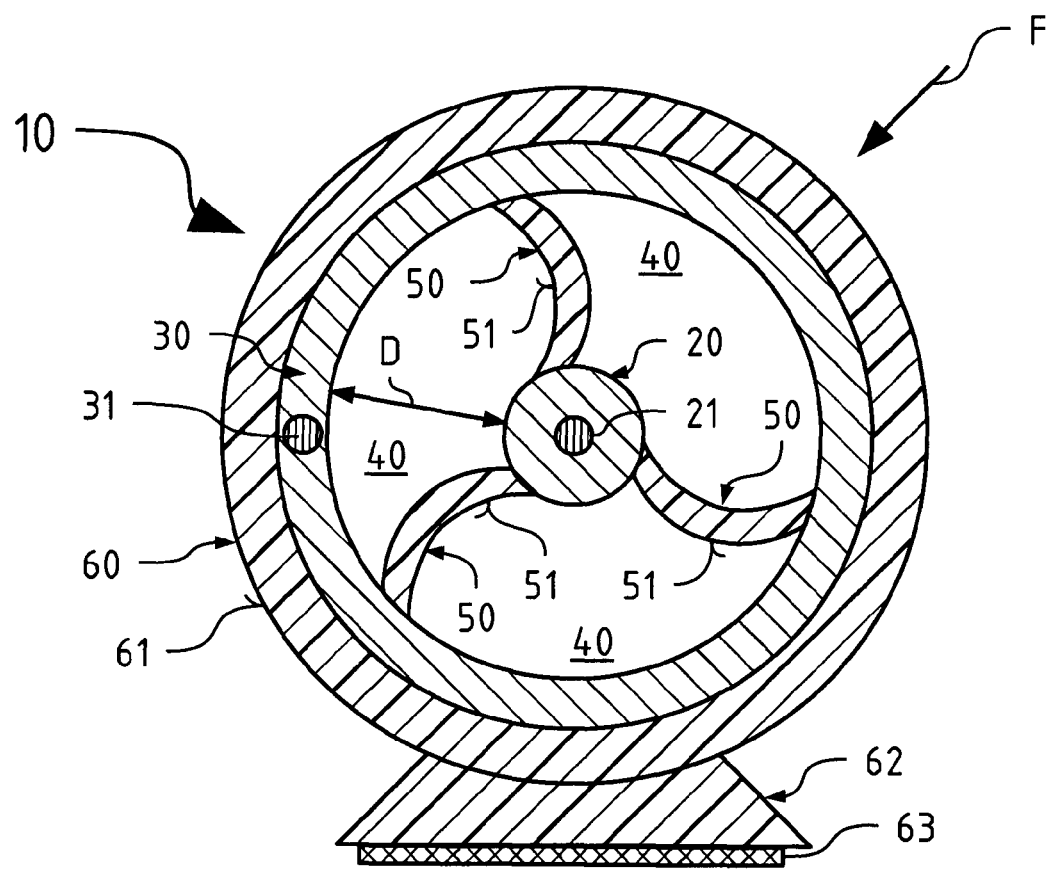
FIG. 9 is a cross-section of a fifth exemplary embodiment of the switch strip.

A switch strip 10 according to a fifth exemplary embodiment, with reference to FIG. 9, has a structure corresponding to the third exemplary embodiment. In addition, the present exemplary embodiment comprises an adhesive base 62 which is arranged on the sheath 60. The adhesive base 62 is able to be co-extruded with the sheath 60. Furthermore, the adhesive base 62 comprises an adhesive tape 63 which is applied to a surface of the adhesive base 62 facing away from the switch strip 10. The switch strip 10 can thus be adhesively glued to a surface without the use of a carrier profile. It is of course also possible to use the adhesive base 62 with the other exemplary embodiments.

Figure 10:
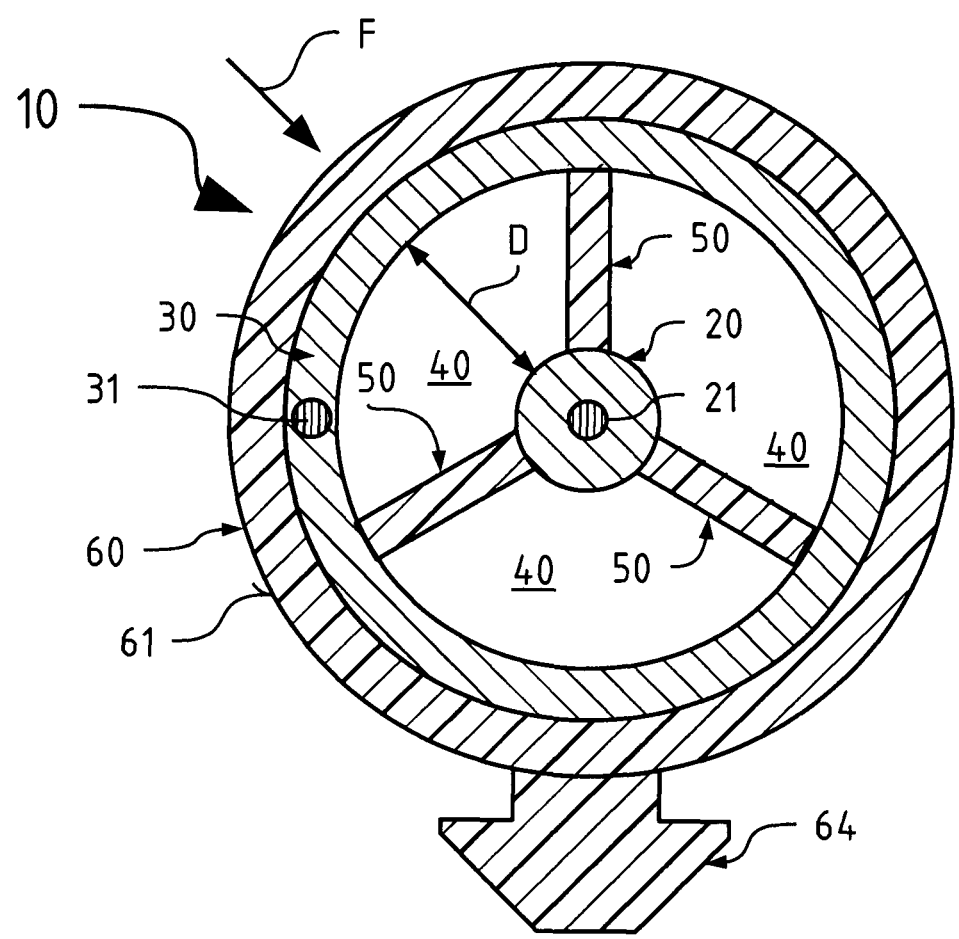
FIG. 10 is a cross-section of a sixth exemplary embodiment of the switch strip.

A switch strip 10 according to a sixth exemplary embodiment, with reference to FIG. 10, has a structure corresponding to the first exemplary embodiment. In addition, the present exemplary embodiment comprises a tie-in base 64 which is arranged on the sheath 60. The tie-in base 64 is able to be co-extruded with the sheath 60. The switch strip 10 can be inserted in recesses and the like with the aid of the tie-in base 64 without the use of a carrier profile. It is of course also possible to use the tie-in base 64 with the other exemplary embodiments.

Figure 11:
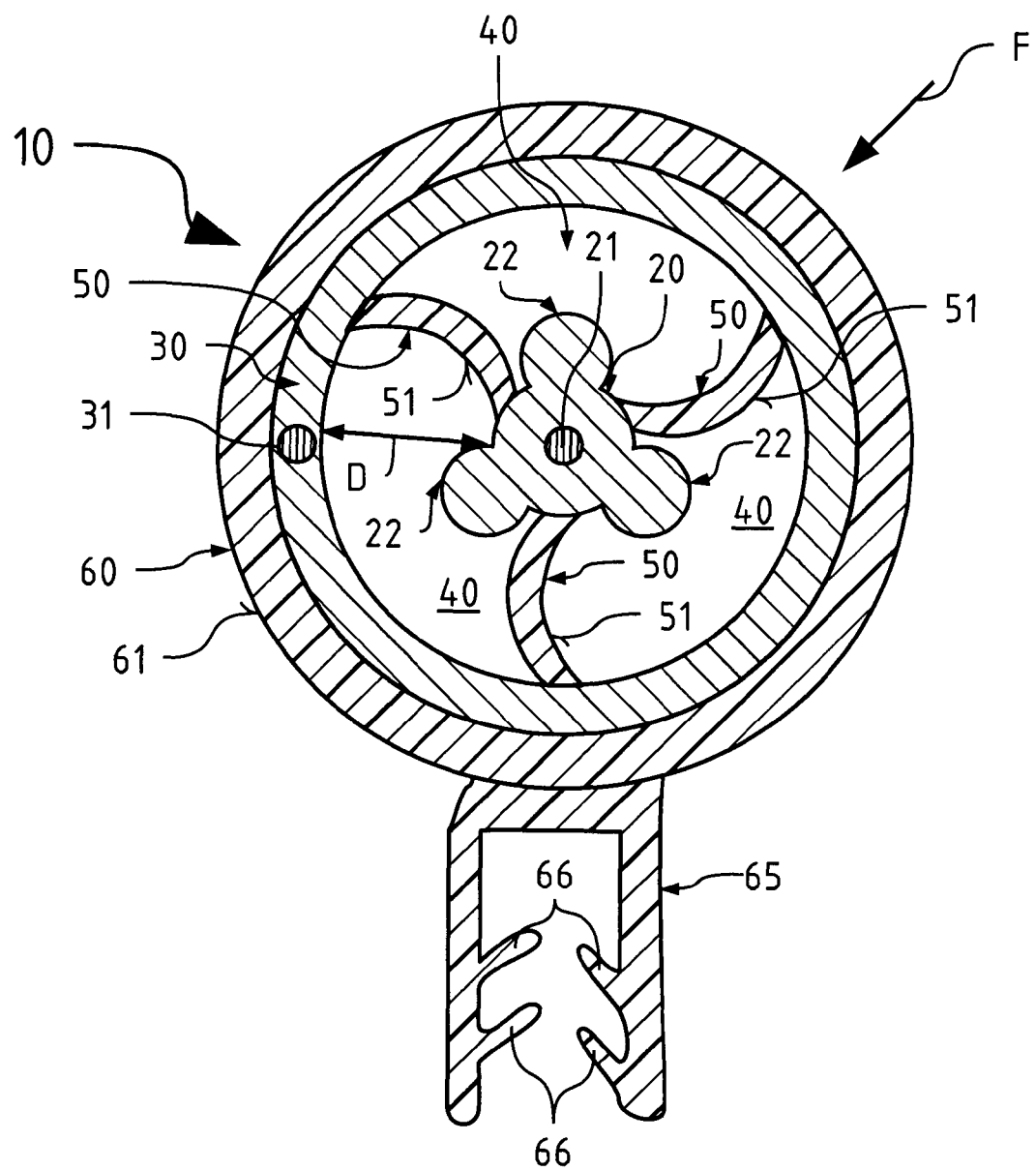
FIG. 11 is a cross-section of a seventh exemplary embodiment of the switch strip.

A switch strip 10 according to a seventh exemplary embodiment, with reference to FIG. 11, has a structure corresponding to the fourth exemplary embodiment. In addition, the present exemplary embodiment comprises a trapping base 65 which is arranged on the sheath 60. The trapping base 65 is able to be co-extruded with the sheath. The trapping base 65 is made such that it can be set on a flange. Trapping lips 66 arranged in the trapping base 65 clip engage the switch strip with the flange. It is of course also possible to use the trapping base 65 with the other exemplary embodiments.

Figure 12:
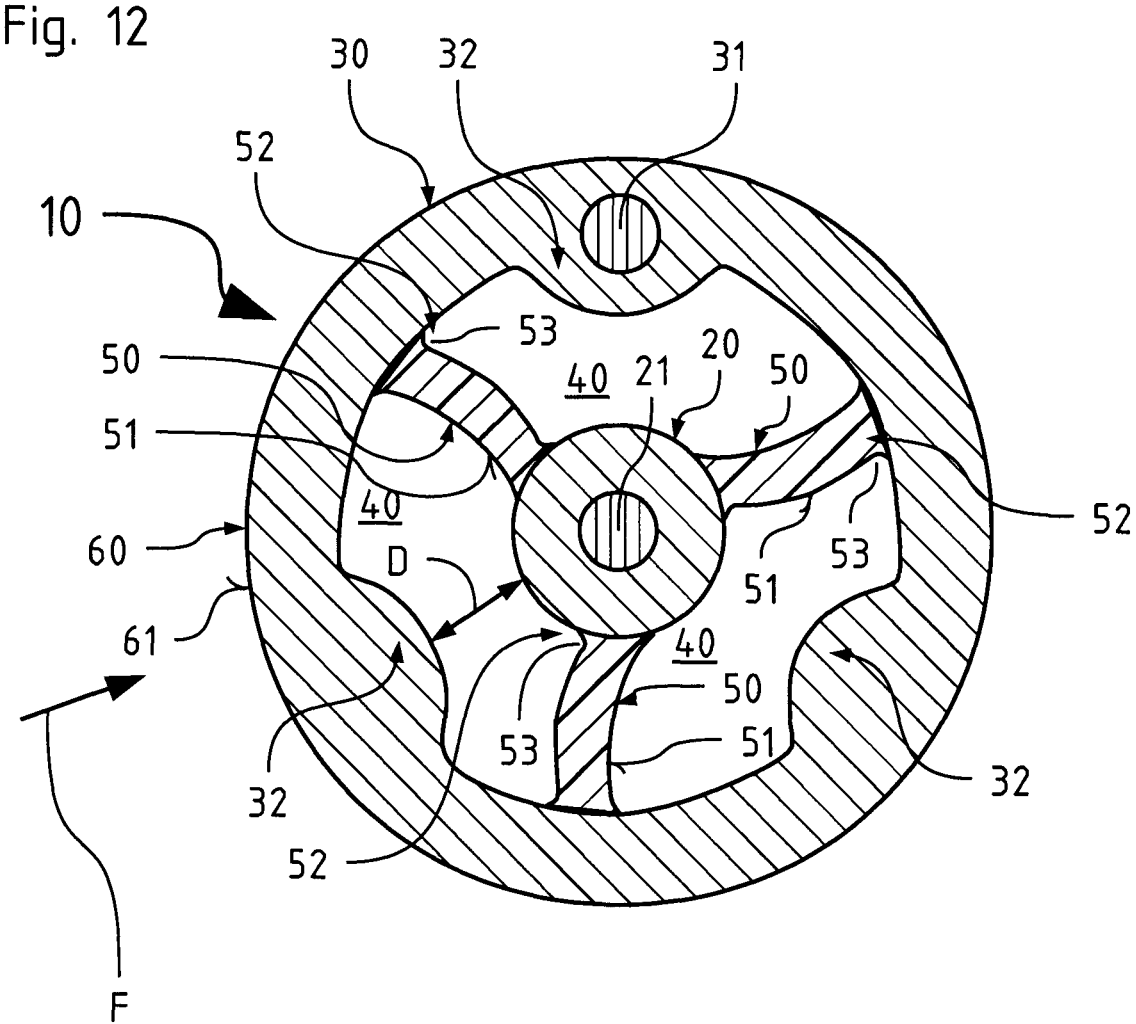
FIG. 12 is a cross-section of an eighth exemplary embodiment of the switch strip.

A switch strip 10 according to an eighth exemplary embodiment, with reference to FIG. 12, is similar to the fourth exemplary embodiment. In contrast to the latter, the outer electrode 30 comprises three protrusions 32 instead of the inner electrode 20. The protrusions 32 are formed as concavely curved elevations as seen from the inner electrode 20. Three, preferably equidistantly arranged spacers 50 have a curved configuration in cross-profile. The spacers 50 also have weakening zones 52 which facilitate easy buckling. The weakening zones 52 are formed, for example, by recesses 53 in the spacer 50. Although the weakening zones 52 are only described in the present exemplary embodiment, they are applicable to other exemplary embodiments of the invention.

As indicated by force arrows in FIGS. 5 to 12, the direction of the force F applied to the switch strip 10 from the outside plays a minor role, as shown in the table of FIG. 13. The angle of rotation is measured in the circumferential direction of the switch strip 10. With the angle of rotation indicated as "o" or with the angles of rotation with-out indication, the switch strip 10 was bent upwards as seen in the longitudinal direction. With the angle of rotation indicated as "u" the switch strip 10 was bent downwards in the longitudinal direction. The bending radius is measured from the center of bending of the switch strip 10 up to its outer surface, such as the sliding layer 61. The column "contact" indicates whether the electrodes 20, 30 of the switch strip 10 touch each other in the bent state. The column "sensor position" schematically shows the orientation of the switch strip. In the computed cases, bending of the switch strip 10 along the longitudinal axis causes a deformation of the outer electrode 20, so that the electrodes 20, 30 come into contact with each other. Only when the force F is applied to the outer electrode 20 from the outside can the electrodes 20, 30 touch each other. The specific selection of the distance D is also less relevant, since only changes in the capacitance or a direct short circuit of the two electrodes 20, 30 constitute a switching event.

Figure 14:
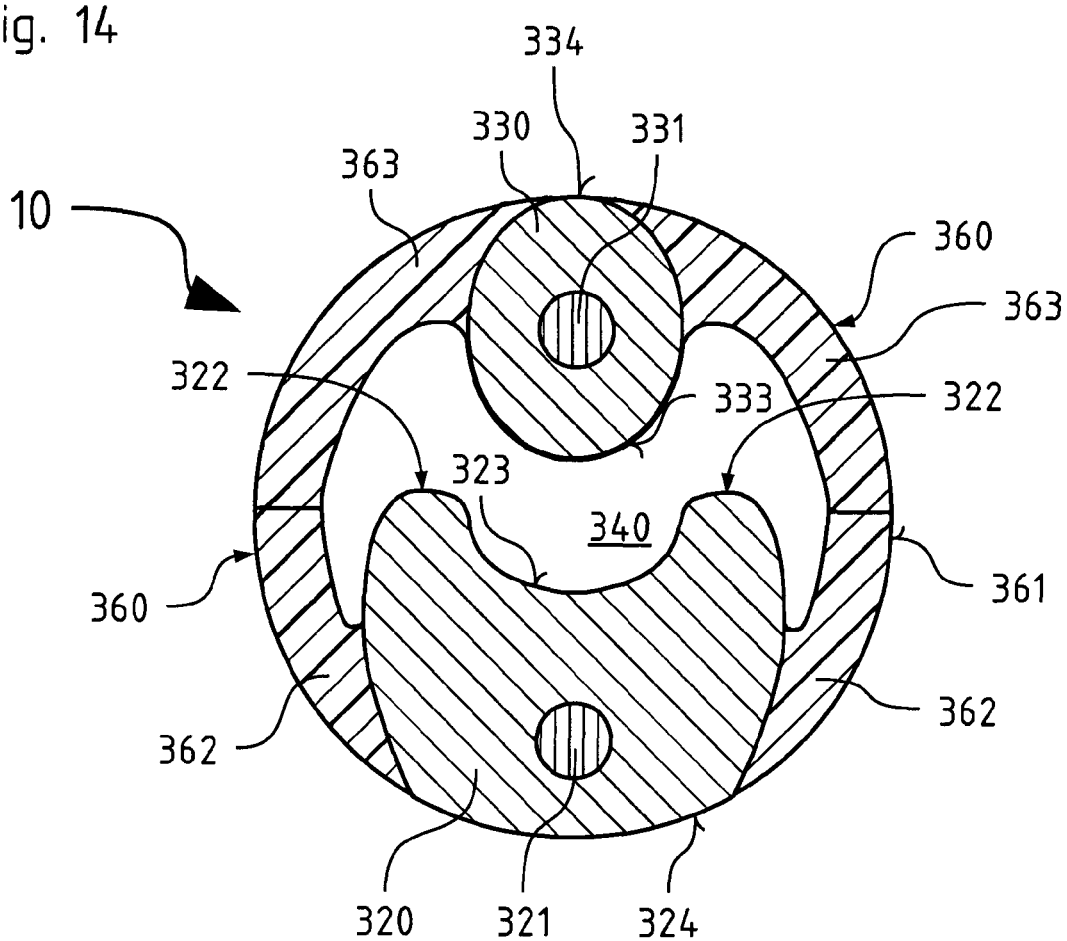
FIG. 14 is a cross-section of a ninth exemplary embodiment of the switch strip.

The ninth exemplary embodiment of a switch strip 310, with reference to FIG. 14, comprises a ground electrode 320, a sensor electrode 330, a space 340 and a sheath 360. The switch strip 310 has a center, a capacitance, and extends in a longitudinal direction perpendicular to the drawing plane. The sheath 360 includes a ground portion 362 and a sensor portion 363. The sheath 360 is formed of EPDM, is elastically deformable and insulating. The ground portion 362 and the sensor portion 363 essentially have a semicircular configuration.

The ground electrode 320 is arranged in the ground portion 362. The ground electrode 320 is formed of EPDM provided with a conductive additive, such as graphite. A ground wire 321 of a conductive material, such as copper, is embedded in the ground electrode 320. The ground electrode 320 has a first inner contact surface 323 facing the center and has a first outer contact surface 324 facing away from the center. The inner contact surface 323 is concavely curved. The ground electrode 322 furthermore includes two protrusions 322 arranged adjacent to the first inner contact surface 323. The protrusions 322 have a convex curvature. The radii of curvature of the protrusions 322 are smaller than each of the radii of curvature of the inner contact surface 323. In particular, the two protrusions 322 have identical radii of curvature. The protrusions 322 and the inner contact surface 323 are adapted to the sensor electrode 330 so that the protrusions 322 and the inner contact surface 323 can completely embrace the sensor electrode 330 even when the ground electrode 320 has not yet been deformed.

The sensor electrode 330 is arranged in the sensor portion 363. The sensor electrode 330, just like the ground electrode 320, is formed of EPDM provided with a conductive additive, such as graphite, and has an embedded sensor wire 331 which is also made of a conductive material, such as copper. The sensor electrode 320 has a second inner contact surface 333 facing the center and has a second outer contact surface 334 facing away from the center. The second inner contact surface 333 is convexly curved in such a manner that the inner contact surface 323 can be in contact with it over its entire surface without having to be deformed.

The space 340, which is between the ground electrode 320 and the sensor electrode 330, is filled with air. The switch strip 310 is provided with a sliding layer 361 of an insulating paint which insulates the outer contact surfaces 324, 334 against the environment. The entire switch strip 310 is integrally extruded in one processing step, however, it can also be manufactured in a different way.

If a force F is now applied to the switch strip 310 from the outside, first the sheath 360 is deformed and thus the sensor electrode 330 is moved. This changes the distance D between the two electrodes 320, 330. Since the switch strip 310 forms a capacitor, the capacitance of the switch strip 310 changes when the distance D between the electrodes 320, 330 is changed. This change in capacitance can be detected by a suitable electronic circuit, such as the control unit described below, and can constitute a switching event.

If the force F is strong enough, the switch strip 310 will be deformed to such an extent that the two electrodes 320, 330 come into contact with each other at their inner contact surfaces 323, 333. This short circuit can also constitute a switching event.

Figure 15:
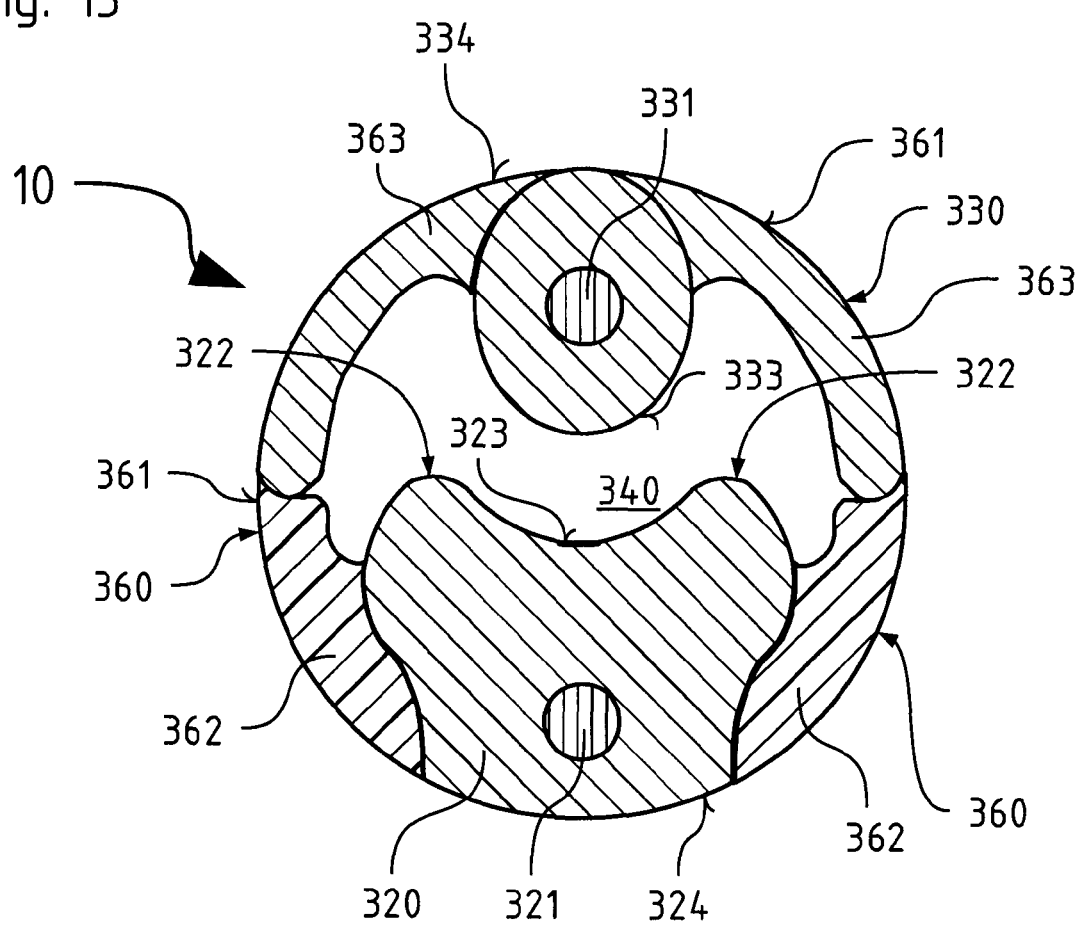
FIG. 15 is a cross-section of a tenth exemplary embodiment of the switch strip.

The tenth exemplary embodiment of a switch strip 310, with reference to FIG. 15, is similar to the eighth exemplary embodiment and will therefore only be described in terms of its differences.

In the switch strip 310 according to the ninth exemplary embodiment, the sensor portion 363 is formed of EPDM provided with a conductive additive, such as graphite.

Figure 4:
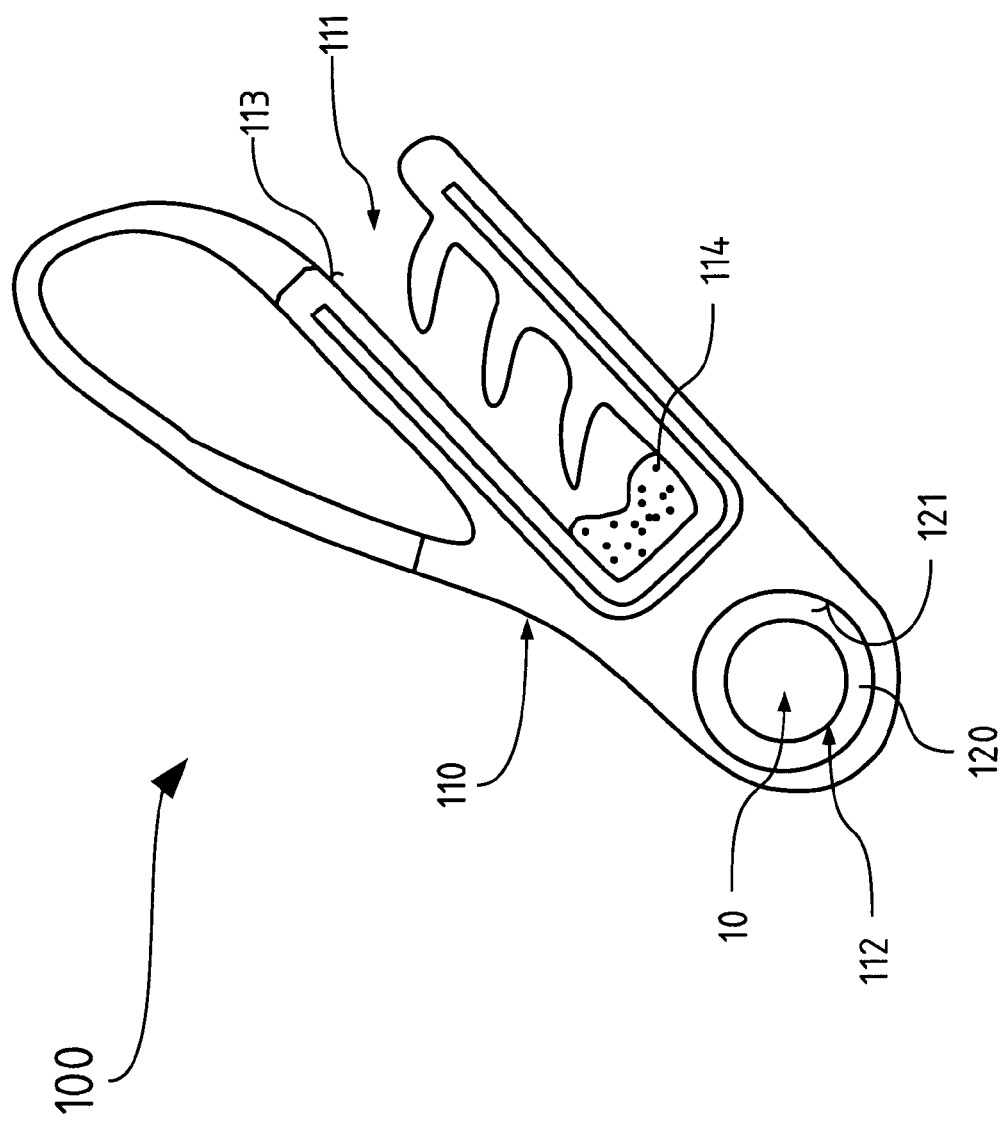
FIG. 4 is a cross-section of an exemplary embodiment of the safety sensor strip.

An exemplary safety sensor strip 100 according to the present invention, with reference to FIG. 4, comprises a carrier profile 110 and a switch strip 10 according to the present invention. The carrier profile 110 comprises an attachment portion 111 and a receiving portion 112. The attachment portion 111 is for attaching the safety sensor strip 100 at an area to be monitored. The receiving portion 112 receives the switch strip 10. The attachment portion 111 is additionally provided with an adhesive layer 113 and a sealing sub-stance 114 to reliably attach the safety sensor strip 100 on a protrusion or a flange. The sealing substance 114 protects the protrusion or flange against moisture and soiling. In addition, the sealing substance 114 increases the sealing action of the carrier profile 110.

The receiving portion 112 is formed as a cavity 120 in which the switch strip 10 is threaded. To facilitate threading of the switch strip 10 the cavity 120 is provided with a sliding layer 121 of a thermoplastic vulcanizate. The switch strip 10 can twist during threading which is not relevant, however, due to the radial symmetry of the switch strip 10. The safety sensor strip 100 is thus more easily and more cost-effectively manufacturable.

Figure 1:
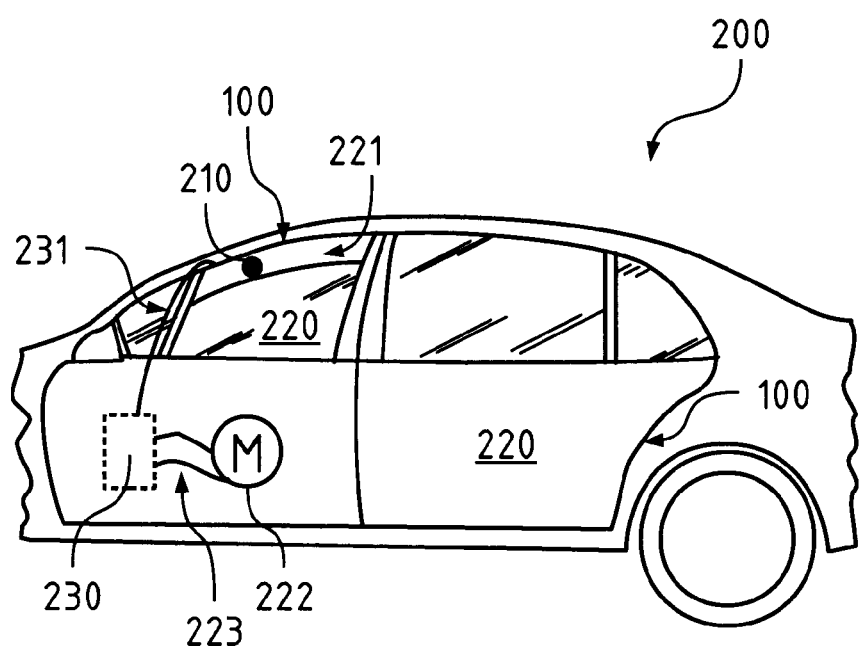
FIG. 1 is a drawing of an automotive vehicle with an anti-trap protection.

The safety sensor strip 100 is used, for example, with a sliding door, as is schematically shown in FIG. 2 and FIG. 3. The sliding door in this case is a closure element 220 having a movement range 221. The safety sensor strip 100 is arranged on a door edge. As seen in FIG. 3, the safety sensor strip 100 follows the curvature of the door. The safety sensor strip 100 is used in an apparatus for detecting an obstruction 210 as shown in FIG. 1. Such an apparatus is also referred to as an anti-trap protection.

An automotive vehicle 200 is equipped with an anti-trap protection. The anti-trap protection comprises a safety sensor strip 100, a closure element 220 and a control unit 230. The closure element 220 has a movement range 221 in which it moves between an open and a closed position. The closure element 220 is driven by a motor 222 for opening or closing. The motor 222 is connected with the control unit 230 by means of a drive line 223. The control unit 230 comprises a sensor line 231 connected with the safety sensor strip 100.

If the closure element 220 is closed and there is an obstruction 210 in the movement range 221, the safety sensor strip 100 is deformed by the obstruction. The deformation of the safety sensor strip 100 results in a switching event of the switch strip 10, which is fed to the control unit 230 via the sensor line 231. The control unit 231 first de-energizes the motor 222 and then has the motor 222 reverse a small distance. In this obstruction 210 is released, and it can be removed.

A method of manufacturing a safety sensor strip 100 comprises providing a switch strip 10 including a sheath 60, and a carrier profile 110 including a receiving portion 112 and an attachment portion 111. The receiving portion 112 comprises a cavity 120 and the attachment portion 111 has a planar configuration.

The sheath 60 is provided with a sliding layer 61. One end of the switch strip 10 is arranged on one end of the carrier profile 110 and is gripped by a drawing means extending from the other end of the carrier profile 110 through the cavity 120. The drawing means is drawn while being rotated until a desired length of the carrier profile is provided with the switch strip 10. Herein, the rotation of the drawing means is transferred to the switch strip 10 which is thus twisted along the longitudinal direction in a controlled fashion. The attachment portion is provided with an adhesive layer 113.

The switch strip 10 can generate a switching event in a capacitive or tactile manner irrespective of the direction of application of the force F. During threading of the switch strip 10 into the carrier profile 110 the orientation of the switch strip 10 therefore need not be considered. The sliding layer 61, 121 facilitates threading. The safety sensor strip 100 comprising the carrier profile 110 and the switch strip 10 can be manufactured more easily and more cost-effectively. The anti-trap protection can be used with automotive vehicles for windows, sunroofs or doors, but also with garage doors, for example.

| List of reference numerals | |
|---|---|
| 10 | switch strip |
| 20 | inner electrode |
| 21 | inner wire |
| 22 | protrusion |
| 30 | outer electrode |
| 31 | outer wire |
| 32 | protrusion |
| 40 | space |
| 50 | spacer |
| 51 | side surface |
| 52 | weakening zone |
| 53 | recess |
| 60 | sheath |
| 61 | sliding layer |
| 62 | adhesive base |
| 63 | adhesive tape |
| 64 | tie-in base |
| 65 | trapping base |
| 66 | trapping lip |
| 100 | safety sensor strip |
| 110 | carrier profile |
| 111 | attachment portion |
| 112 | receiving portion |
| 113 | adhesive layer |
| 114 | sealing substance |
| 120 | cavity |
| 121 | sliding layer |
| 200 | automotive vehicle |
| 210 | apparatus for detecting an obstruction |
| 220 | closure element |
| 221 | movement range |
| 222 | motor |
| 223 | drive line |
| 230 | control unit |
| 231 | sensor line |
| 310 | switch strip |
| 320 | ground electrode |
| 321 | ground wire |
| 322 | protrusion |
| 323 | concave inner contact surface |
| 324 | first convex outer contact surface |
| 330 | sensor electrode |
| 331 | sensor wire |
| 333 | convex inner contact surface |
| 334 | second convex outer contact surface |
| 340 | space |
| 360 | sheath |
| 361 | sliding layer |
| 362 | ground portion |
| 363 | sensor portion |
| D | distance |
| F | force |

The invention claimed is:

1. A switch strip for an apparatus for detecting an obstruction in the movement range of a closure element, in particular of an automotive vehicle, wherein the switch strip extends in a longitudinal direction and has a capacitance, comprising:
an inner electrode, to which a first electric charge is applicable;
an outer electrode, which is deformable by a force (F) applied from the outside, to which a second electric charge is applicable and which is formed to be approximately circular in a section extending transverse to the longitudinal direction and approximately concentrically surrounds the inner electrode at a distance (D);
a space filled with air, which is arranged between the outer electrode and the inner electrode and which is dielectric; and
at least one spacer, which has a curved configuration in cross-section, which has two curved side surfaces, which are curved in the same circumferential direction as the switch strip, and is deformable in a direction transverse to the longitudinal direction and which spaces and insulates the inner electrode from the outer electrode,
wherein, when the outer electrode is deformed, the deformation is able to at least in portions bring the inner electrode and the outer electrode into contact with each other.

2. The switch strip of claim 1, further comprising at least one further spacer, wherein the spacers are equidistantly arranged in the circumferential direction of the electrodes.

3. The switch strip of claim 1, wherein the spacer has an approximately rectangular cross-section.

4. The switch strip of claim 1, wherein the spacer has a weakening zone.

5. The switch strip, wherein the outer electrode comprises at least three protrusions, wherein the protrusions are equidistantly spaced from each other in the circumferential direction.

6. The switch strip of claim 1, further comprising an outer wire embedded in the outer electrode and/or an inner wire embedded in the inner electrode.

7. The switch strip of claim 1, wherein the outer electrode and/or the inner electrode are at least partially made, in particular extruded, of an elastomer provided with electrically conductive particles.

8. The switch strip of claim 1, further comprising a sheath, wherein the sheath is adjacent to the outer electrode.

9. The switch strip of claim 8, wherein the sheath includes a sliding layer, in particular of a paint, a thermoplastic vulcanizate and/or a foil.

10. The switch strip of claim 1, wherein the sheath and/or the spacer are made, in particular extruded, of an elastomer, in particular of an ethylene propylene diene rubber or a thermoplastic elastomer.

11. A safety sensor strip, comprising:
a carrier profile including an attachment portion and a receiving portion, and
a switch strip arranged in the receiving portion,
the switch strip comprising:
an inner electrode to which a first electric charge is applicable;
an outer electrode, which is deformable by a force (F) applied from the outside, to which a second electric charge is applicable and which is formed to be approximately circular in a section extending transverse to the longitudinal direction and approximately concentrically surrounds the inner electrode at a distance (D);
a space filled with air, which is arranged between the outer electrode and the inner electrode and which is dielectric; and
at least one spacer, which has a curved configuration in cross-section, which has two curved side surfaces, which are curved in the same circumferential direction as the switch strip, and is deformable in a direction transverse to the longitudinal direction and which spaces and insulates the inner electrode from the outer electrode,
wherein, when the outer electrode is deformed, the deformation is able to at least in portions bring the inner electrode and the outer electrode into contact with each other.

12. The safety sensor strip of claim 11, wherein the receiving portion comprises a cavity and the switch strip is arranged in the cavity.

13. An apparatus for detecting an obstruction in the movement range of a closure element, in particular of an automotive vehicle, comprising:
  a safety sensor strip, comprising:
    an inner electrode to which a first electric charge is applicable;
    an outer electrode, which is deformable by a force (F) applied from the outside, to which a second electric charge is applicable and which is formed to be approximately circular in a section extending transverse to the longitudinal direction and approximately concentrically surrounds the inner electrode at a distance (D);
    a space filled with air, which is arranged between the outer electrode and the inner electrode and which is dielectric; and
    at least one spacer, which has a curved configuration in cross-section, which has two curved side surfaces, which are curved in the same circumferential direction as the switch strip, and is deformable in a direction transverse to the longitudinal direction and which spaces and insulates the inner electrode from the outer electrode,
    wherein, when the outer electrode is deformed, the deformation is able to at least in portions bring the inner electrode and the outer electrode into contact with each other, and
  a control unit, which controls an opening and closing operation of the closure element in dependence on the safety sensor strip.

14. A method of manufacturing a safety sensor strip of a type that includes a carrier profile including an attachment portion and a receiving portion, and a switch strip, which is arranged in the receiving portion, comprising the steps of:
  a) providing the carrier profile;
  b) providing the switch strip, wherein the switch strip is of a type comprising an inner electrode to which a first electric charge is applicable, an outer electrode, which is deformable by a force (F) applied from the outside, to which a second electric charge is applicable and which is formed to be approximately circular in a section extending transverse to the longitudinal direction and approximately concentrically surrounds the inner electrode at a distance (D), a space filled with air, which is arranged between the outer electrode and the inner electrode and which is dielectric, and at least one spacer, which has a curved configuration in cross-section, which has two curved side surfaces, which are curved in the same circumferential direction as the switch strip, and is deformable in a direction transverse to the longitudinal direction and which spaces and insulates the inner electrode from the outer electrode, wherein, when the outer electrode is deformed, the deformation is able to at least in portions bring the inner electrode and the outer electrode into contact with each other; and
  c) threading the switch strip into the cavity while rotating the switch strip and/or applying pressurized air to a boundary volume between the outer surface of the switch strip and the inner surface of the receiving portion.

15. The switch strip of claim 2, wherein the outer electrode comprises at least three protrusions, and wherein the protrusions are spaced from each other in the circumferential direction.

16. The switch strip of claim 4, wherein the weakening zone is formed as a recess in the spacer or by an elastomeric region having reduced hardness in comparison to an adjacent elastomeric region.

17. The switch strip of claim 5, further comprising an outer wire embedded in the outer electrode and/or an inner wire embedded in the inner electrode.

18. The switch strip of claim 5, wherein the outer electrode and/or the inner electrode are at least partially made, in particular extruded, of an elastomer provided with electrically conductive particles.

19. The switch strip of claim 8, wherein the sheath and/or the spacer are made, in particular extruded, of an elastomer, in particular of an ethylene propylene diene rubber or a thermoplastic elastomer.

20. The safety sensor strip of claim 11 wherein the spacer has a weakening zone.

* * * * *